United States Patent
Zhang et al.

[11] Patent Number: 6,087,648
[45] Date of Patent: Jul. 11, 2000

[54] ACTIVE MATRIX DISPLAY DEVICE AND METHOD OF MANUFACTURING THE SAME

[75] Inventors: Hongyong Zhang; Masayuki Sakakura, both of Kanagawa, Japan

[73] Assignee: Semiconductor Energy Laboratory Co., Ltd., Kangawa-ken, Japan

[21] Appl. No.: 09/104,979

[22] Filed: Jun. 26, 1998

[30] Foreign Application Priority Data

Jul. 1, 1997 [JP] Japan .................................... 9-191775

[51] Int. Cl.[7] ........................... H01L 21/00; H01L 27/00; G09G 3/20
[52] U.S. Cl. ......................... 250/208.1; 257/72; 257/435; 345/98
[58] Field of Search ............................. 250/208.1, 208.2, 250/216, 214.1, 214 R; 345/87, 98, 104, 156, 204, 205, 207; 257/72, 431, 432, 435; 438/29, 30, 57, 59, 60, 66, 69

[56] References Cited

U.S. PATENT DOCUMENTS

| | | | |
|---|---|---|---|
| 5,349,174 | 9/1994 | Van Berkel et al. ................ | 250/208.1 |
| 5,589,847 | 12/1996 | Lewis ......................................... | 345/98 |
| 5,650,637 | 7/1997 | Kodaira et al. ............................ | 257/72 |
| 5,684,318 | 11/1997 | Ayres et al. .............................. | 257/334 |

*Primary Examiner*—John R Lee
*Attorney, Agent, or Firm*—Eric J. Robinson; Nixon Peabody LLP

[57] ABSTRACT

In an active matrix display device integrated with peripheral drive circuits, an image sensor is provided on the same substrate as a pixel matrix and peripheral drive circuits. The image sensor is formed on the substrate having pixel electrodes, pixel TFTs connected to the pixel electrodes and CMOS-TFTs for driving the pixel TFTs. The light receiving unit of the image sensor has light receiving elements having a photoelectric conversion layer and light receiving TFTs. These TFTs are produced in the same step. The lower electrode and transparent electrode of the light receiving element are produced by patterning the same film as the light shielding film and the pixel electrodes arranged in the pixel matrix.

6 Claims, 8 Drawing Sheets

ACTIVE MATRIX DISPLAY DEVICE AND METHOD OF MANUFACTURING THE SAME

BACKGROUND OF THE INVENTION

1. Field of the Invention

The present invention relates to an active matrix display device comprising a pixel matrix and peripheral drive circuits formed on the same substrate. The present invention also relates to a method of manufacturing therefor.

2. Description of the Related Art

Intensive studies have recently been made on a technology for TFTs using polycrystal silicon called "polysilicon TFT." This makes it possible to produce a drive circuit such as a shift register circuit using this polysilicon TFT and to implement an active matrix liquid crystal panel comprising a pixel portion and peripheral drive circuits for driving the pixel portion both of which are integrated on the same substrate. Therefore, a liquid crystal panel has been reduced in cost, size and weight and used in the display device of information equipment such as personal computers, portable telephones, video cameras and digital cameras and portable equipment.

Inexpensive pocket-sized small portable information processing terminal devices having higher portability than notebook-type personal computers have recently been implemented and an active matrix liquid crystal panel is used in the display devices of these devices. Although such an information processing terminal device enables data to be input from the display device with a touch pen, a peripheral device such as a scanner or digital camera is required to input image information or character and graphic information on paper. Therefore, the portability of the information processing terminal device is lost. Further, an economical burden for the purchase of such a peripheral device is cast upon a user.

An active matrix display device is also used in the display devices of teleconferencing systems, TV phones, Internet terminals and the like. These systems and terminals are equipped with a camera for picking up images of the other party or a user and their display devices and camera units are manufactured as separate modules.

SUMMARY OF THE INVENTION

An object of the present invention is to provide an intelligent display device which can solve the above problems and has an image pick-up function and a display function by providing an image sensor on a substrate having a pixel matrix and peripheral drive circuits formed thereon.

Another object of the present invention is to manufacture at a low cost an intelligent display device in which an image sensor or/and solar cells is/are made compatible with a pixel matrix and peripheral drive circuits in structure and production process.

To solve the above problems, according to a first aspect of the present invention, there is provided an active matrix display device comprising a pixel matrix having pixel electrodes arranged in a matrix form and first active elements connected to the pixel electrodes and peripheral drive circuits for driving the first active elements, all of which are provided on the same substrate, wherein an image sensor comprising a light receiving unit having photoelectric conversion elements and second active elements connected to the photoelectric conversion elements and a drive circuit for driving the second active elements is provided on the substrate; and each of the photoelectric conversion elements has a first electrode, a photoelectric conversion layer formed on the first electrode, and a second electrode formed on the photoelectric conversion layer, the first and second electrodes being made of the same film as a conductive film formed on the pixel matrix.

According to a second aspect of the present invention, there is provided an active matrix display device comprising a pixel matrix having pixel electrodes arranged in a matrix form and first active elements connected to the pixel electrodes and peripheral drive circuits for driving the first active elements, all of which are provided on the same substrate, wherein:

an optically electromotive device is provided on the substrate; and the optically electromotive device has a first electrode, a photoelectric conversion layer formed on the first electrode and a second electrode formed on the photoelectric conversion layer, the first and second electrodes being made of the same film as a conductive film formed on the pixel matrix.

According to a third aspect of the present invention, there is provided an active matrix display device comprising a pixel matrix having pixel electrodes arranged in a matrix form and first active elements connected to the pixel electrodes and peripheral drive circuits for driving the first active elements, all of which are provided on the same substrate, wherein an image sensor comprising a light receiving unit having photoelectric conversion elements and second active elements connected to the photoelectric conversion elements and a drive circuit for driving the second active elements is provided on the substrate;

the pixel matrix has first active elements formed on the substrate, a first insulating film covering the first active elements, a light shielding film formed on the first insulating film, a second insulating film formed on the light shielding film, and pixel electrodes formed on the second insulating film and electrically connected to the first active elements through contact holes formed in the first and second insulating films; and the light receiving unit has second active elements formed on the substrate, the first insulating film covering the second active elements, lower electrodes formed on the first insulating film and made of the same film as the light shielding film, a photoelectric conversion layer formed on the lower electrodes and transparent electrodes formed on the photoelectric conversion layer and made of the same film as the pixel electrodes.

According to a fourth aspect of the present invention, there is provided a method of manufacturing an active matrix display device comprising:

a pixel matrix having pixel electrodes arranged in a matrix form and first active elements connected to the pixel electrodes;

peripheral drive circuits for driving the first active elements; and an image sensor comprising a light receiving unit having photoelectric conversion elements and second active elements connected to the photoelectric conversion elements and a drive circuit for driving the second active elements, all of which are formed on the same substrate, the process comprising:

a first step of producing the first active elements, the second active elements, the peripheral drive circuits and the drive circuit;

a second step of forming a first insulating film for covering at least the first active elements and the second active elements;

a third step of forming a conductive film on the first insulating film;

a fourth step of patterning the conductive film to form a light shielding film for shielding light from the first active elements and lower electrodes connected to the second active elements;

a fifth step of forming a photoelectric conversion layer on the lower electrodes;

a sixth step of forming a second insulating film on the light shielding film;

a seventh step of forming a transparent conductive film for covering at least the photoelectric conversion layer and the second insulating film; and an eighth step of patterning the transparent conductive film to form pixel electrodes connected to the first active elements and transparent electrodes in contact with the photoelectric conversion layer.

The above and other objectives, features and advantages of the invention will become more apparent from the following description when taken in conjunction with the accompanying drawings.

DETAILED DESCRIPTION OF THE PREFERRED EMBODIMENTS

Figure 1:
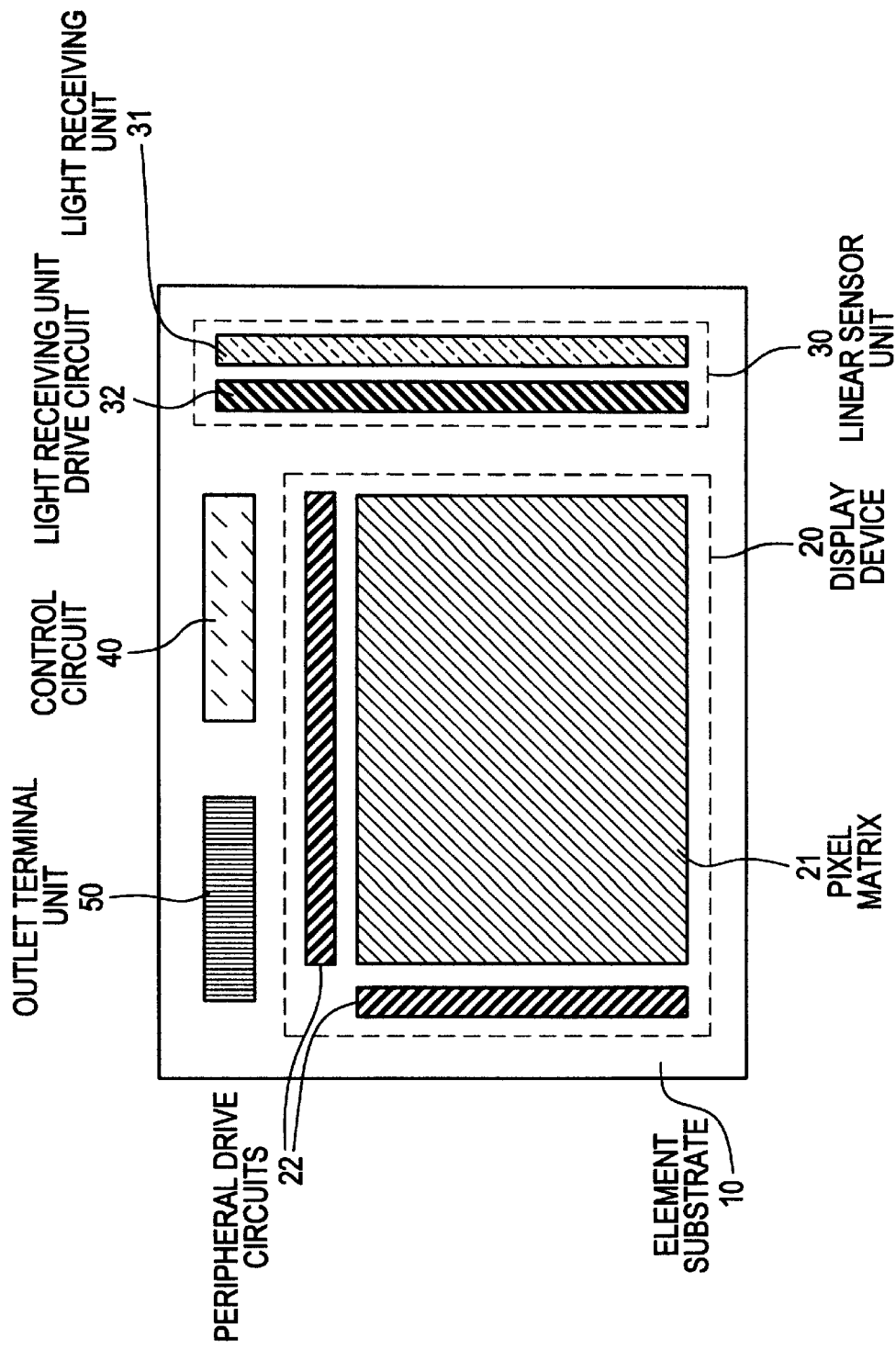
FIG. 1 is a front view of an element substrate according to Embodiment 1 of the present invention.

A peripheral circuit-integrated active matrix display device comprising a contact type image sensor formed integrally according to a preferred embodiment of the present invention will be described with reference to FIGS. 1 and 2. FIG. 1 is a front view of an element substrate 10 of the embodiment of the present invention and FIG. 2 is a schematic sectional view of the element substrate 10.

As shown in FIG. 1, a pixel matrix 21 having pixel electrodes arranged in a matrix form and active elements connected to the pixel electrodes and peripheral drive circuits 22 for driving the pixel matrix 21 are formed on the same substrate. Further, an image sensor 33 comprising a light receiving unit 31 having photoelectric conversion elements and second active elements connected to the photoelectric conversion elements and a drive circuit 32 for driving the light receiving unit 31 is also formed on the element substrate 10.

Figure 2:
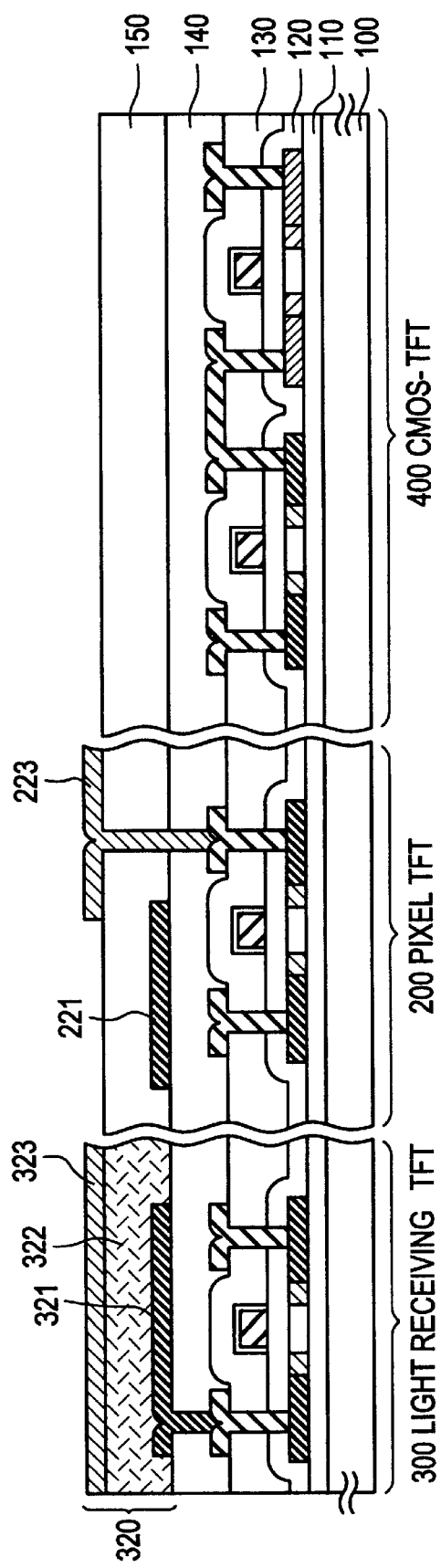
FIG. 2 is a sectional view of the element substrate according to Embodiment 1 of the present invention.

As shown in FIG. 2, the pixel matrix 21 comprises first active elements 200 formed on the substrate 100, a first insulating film 140 covering the first active elements 200, a light shielding film 221 formed on the first insulating film 140, a second insulating film 150 formed on the light shielding film 221, and pixel electrodes 223 formed on the second insulating film 150 and electrically connected to the first active elements 200.

The light receiving unit 31 of the image sensor 30 comprises second active elements 300 formed on the substrate 100, a first insulating film 140 covering the second active elements 300, and photoelectric conversion elements 320 formed on the first insulating film 140 and connected to the second active elements 300, and each of the conversion elements 320 is composed of a lower electrode 321, a photoelectric conversion layer 322 and a transparent electrode 323.

In the present invention, the active elements 200 of the pixel matrix 21, the active elements 300 of the light receiving unit 31, and active elements 400 arranged in the drive circuits 22 and the drive circuit 32 can be formed of TFTs.

These active elements 200, 300 and 400 are completed through the same production process simultaneously. After the active elements 200, 300 and 400 are completed, the light shielding film 221, the pixel electrodes 223 and the photoelectric conversion elements 320 are formed. The lower electrode 321 of the photoelectric conversion element 320 is made of the same film as the light shielding film 221 and formed simultaneously with the light shielding film 221. The transparent electrode 323 is made of the same film as the pixel electrode 223 and formed simultaneously with the pixel electrode 223.

Therefore, the method of manufacturing the element substrate 10 of the present invention is the same as the method of manufacturing a conventional active matrix display device except for the method of manufacturing the photoelectric conversion layer 322. Therefore, the active matrix display device of the present invention can be produced without new investment in equipment and facilities. As a result, the production cost of the active matrix display device can be reduced. Further, since the display device and the image sensor unit are formed on the same substrate, the size and weight of the device can be reduced.

Embodiment 1

A peripheral circuit-integrated active matrix display device according to Embodiment 1 of the present invention in which a contact type image sensor is integrally formed on an element substrate will be described hereinunder.

FIG. 1 is a front view of the element substrate 10 of the embodiment of the present invention. As shown in FIG. 1, the element substrate 10 has a display device 20, linear sensor unit 30, control circuit 40 and outlet terminal unit 50. FIG. 2 is a schematic sectional view of the element substrate 10. In this embodiment, active elements arranged on the element substrate 10 are formed of TFTs.

As shown in FIGS. 1 and 2, the display device 20 has a pixel matrix 21 comprising pixel electrodes 223 arranged in a matrix form and pixel TFTs 200 connected to the pixel electrodes 223 and peripheral drive circuits 22 for driving the pixel TFTs 200 arranged in the pixel matrix 21. Thus, the element substrate 10 has a peripheral circuit-integrated active matrix substrate structure. The pixel matrix 21 has a light shielding film 221 for shielding light from the pixel TFTs 200.

The linear sensor unit 30 has a light receiving unit 31 comprising photoelectric conversion elements 320 and light receiving TFTs 300 connected to the photoelectric conversion elements 320 arranged in a row and a light receiving unit drive circuit 32 for driving the light receiving TFTs 300.

The photoelectric conversion element 320 comprises a lower electrode 321 connected to the light receiving TFT 300, a photoelectric conversion layer 322 formed on the lower electrode 321 and a transparent electrode 323 formed on the photoelectric conversion layer 322.

The control circuit 40 controls the peripheral drive circuits 22 of the display device and the light receiving unit drive circuit 32. The peripheral drive circuits 22, the light receiving unit drive circuit 32 and the control circuit 40 are composed of CMOS-TFTs 400 for constructing a shift register or the like.

The outlet terminal unit 50 is a terminal for connecting the display device 20 and the linear sensor unit 30 to external wires.

The active matrix display device of the embodiment of the present invention enables image data read by the linear sensor unit 30 to be displayed without being processed with a circuit external to the element substrate 10. The control circuit 40 outputs a control signal such as a timing signal to the light receiving unit drive circuit 32. Based on the control signal, the light receiving unit drive circuit 32 starts the switching operation of the light receiving TFTs 300. An electric charge generated by the photoelectric conversion element 320 is outputted to the control circuit 40 from the linear sensor unit 30 as an image signal by this switching operation. The control circuit 40 creates control signals (gate line drive signal and data line drive signal) for the peripheral drive circuits 22 to display the image signal on the display device. Based on the control signals, the peripheral drive circuits 22 drive the pixel matrix 21 to display image data read by the linear sensor unit 30.

Figure 3A:
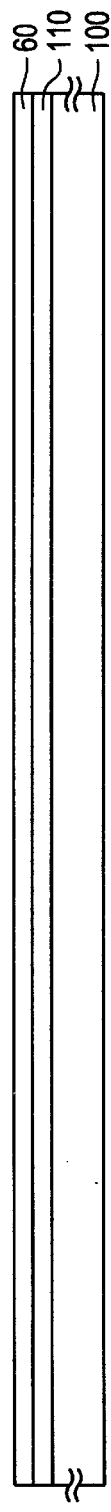
FIGS. 3A to 3D are diagrams for explaining the method of manufacturing the element substrate according to Embodiment 1 of the present invention.

A description is subsequently given of a method of manufacturing the element substrate 10 with reference to FIGS. 3 to 5. As shown in FIG. 3A, a base film 110 is formed on the entire surface of a transparent substrate 100. As the transparent substrate 100 may be used a glass substrate or quartz substrate. As the base film 100, a silicon oxide film is formed to a thickness of 200 nm by the plasma CVD method.

Thereafter, an amorphous silicon film is formed to a thickness of 55 nm by a plasma CVD method and exposed to excimer laser light to form a polycrystal silicon film 60. This crystallization step is important to increase the mobility of the CMOS-TFT 400 in particular. To crystallize the amorphous silicon film, a thermal crystallization method called SPC, RTA method for irradiating ultraviolet light, a method using thermal crystallization and annealing with laser light and the like can be employed (FIG. 3A).

The polycrystal silicon film 60 is then patterned to form island-like semiconductor layers 301, 201, 401, and 402 for forming a source region, drain region and channel forming region for TFTs 200, 300, and 400. A gate insulating film 120 for covering these semiconductor layers 301, 201, 401, and 402 is then formed. The gate insulating film 120 is formed to a thickness of 120 nm by the plasma CVD method using silane ($SiH_4$) and $N_2O$ as raw material gases.

Figure 3B:
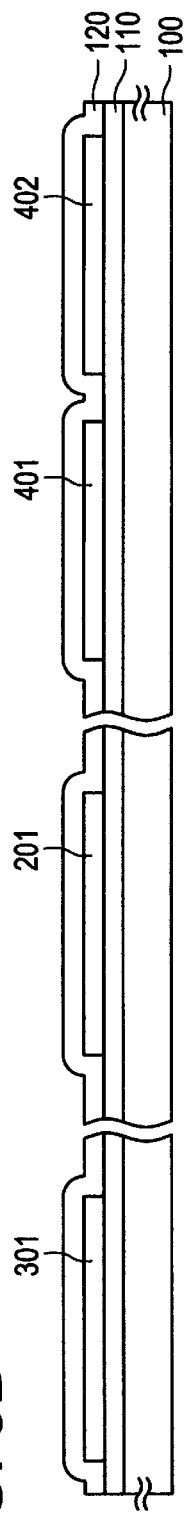

An aluminum film 61 is then formed to a thickness of 300 nm by a sputtering method. To suppress the generation of a hillock or whisker, 0.1 to 0.2% by weight of scandium (Sc) or yttrium (Y) is contained in the aluminum film 61 (FIG. 3B).

An anodic oxide film (not shown) having a dense film property is formed on the surface of the aluminum film 61. To form the anodic oxide film, current is applied between the aluminum film 61 as an anode and platinum as a cathode in an ethylene glycol solution containing 3% tartaric acid. The thickness of the anodic oxide film is controlled by application voltage. In the embodiment of the present invention, the thickness of the anodic oxide film is 10 nm.

Figure 3C:
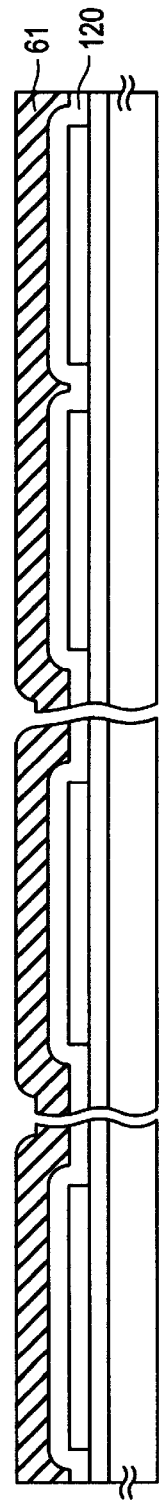
Figure 3D:
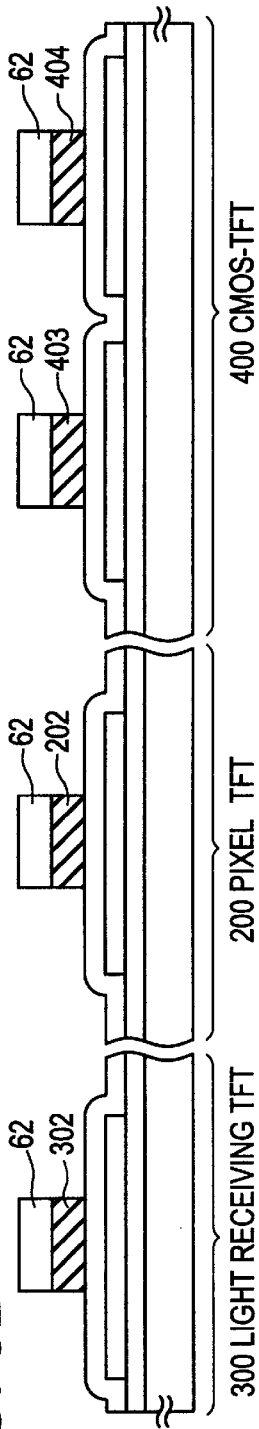

A resist mask 62 is then formed, and the aluminum film 61 is patterned to form electrode patterns 202, 302, 403, and 404. The dense anodic oxide film (not shown) previously formed is intended to improve adhesion between the aluminum film 61 and the resist mask 62 (FIG. 3C).

Figure 4A:
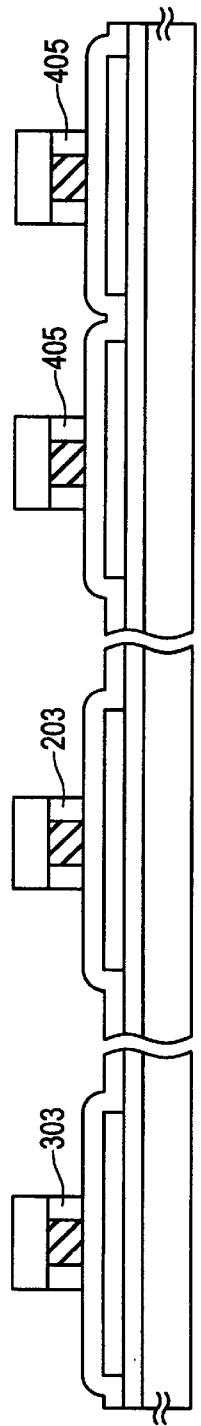
FIGS. 4A to 4D are diagrams for explaining the method of manufacturing the element substrate according to Embodiment 1 of the present invention.

Anodic oxidation is carried out again to form porous anodic oxide films 203, 303, 405, and 406 on the side surfaces of the electrode patterns 202, 302, 403, and 404, respectively, as shown in FIG. 4A. This anodic oxidation step is carried out by applying a current between the electrode patterns 202, 302, 403, and 404 as an anode and platinum as a cathode in an aqueous solution of oxalic acid having a concentration of 3%. The thickness of each of the anodic oxide films 203, 303, 405, and 406 can be controlled by the application time of voltage. The anodic oxide films 203, 303, 405, and 406 are used to form low-concentration impurity regions in the semiconductor layers in a self-aligning manner (FIG. 4A).

After the resist mask 62 is removed by a dedicated release solution, the anodic oxidation step is carried out again to form dense anodic oxide films 204, 304, 407, and 408 around the electrode patterns 202, 302, 403, and 404, respectively. The electrode patterns 202, 302, 403, and 404 which are not anodically oxidized in the above anodic oxidation steps function as substantial gate electrodes 205, 305, 409, and 410, respectively. The dense anodic oxide films 204, 304, 407, and 408 formed around the gate electrodes 205, 305, 409, and 410 serve to protect the gate electrodes electrically and physically, respectively. Further, an offset structure can be formed by these anodic oxide films in a self-aligning manner (FIG. 4B).

Figure 4B:
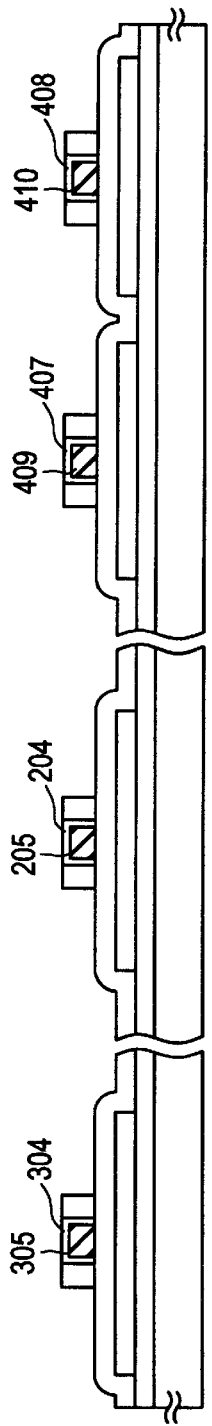
Figure 4C:
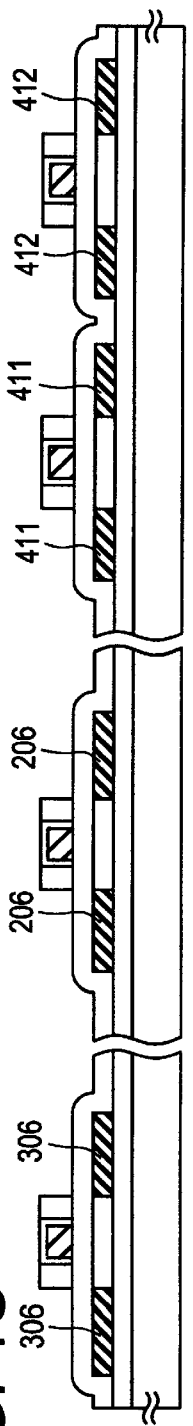

When the state shown in FIG. 4B is obtained, P-ions are doped to provide N-type conductivity to the semiconductor. In the embodiment of the present invention, an ion doping method is used. The ion doping conditions include a dose of $1 \times 10^{15}/cm^2$ and an acceleration voltage of 80 kv. As a result, the gate electrodes and the anodic oxide films serve as masks to form N-type impurity regions 206, 306, 411, and 412 in the semiconductor layers 201, 301, 401, and 402 in a self-aligning manner, respectively (FIG. 4C).

Figure 4D:
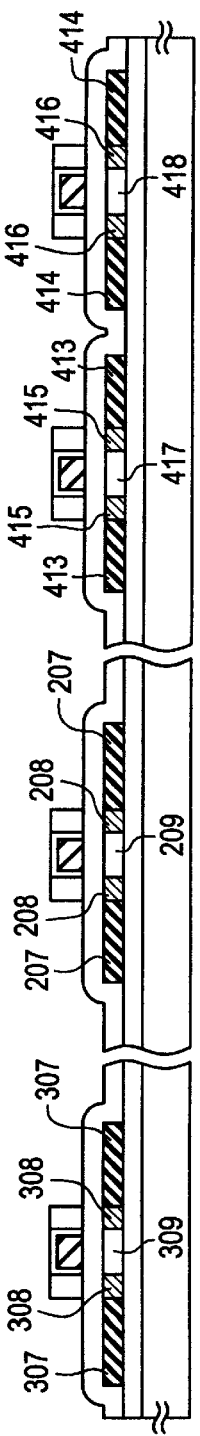

After the porous anodic oxide films 203, 303, 405, and 406 are removed, P-ions are doped by the ion doping method again. The doping conditions include a dose of $1 \times 10^{14}/cm^2$ and an acceleration voltage of 70 kv. As a result, regions 207, 307, 413, and 414 into which P-ions have been implanted in the two doping steps become N-type high-concentration impurity regions and regions 208, 308, 415, and 416 into which P-ions have been implanted only in the second doping step shown in FIG. 4D become N-type low-concentration impurity regions. Regions 209, 309, 417, and 418 into which P-ions have not been implanted in the two doping steps become channel forming regions (FIG. 4D).

Figure 5A:
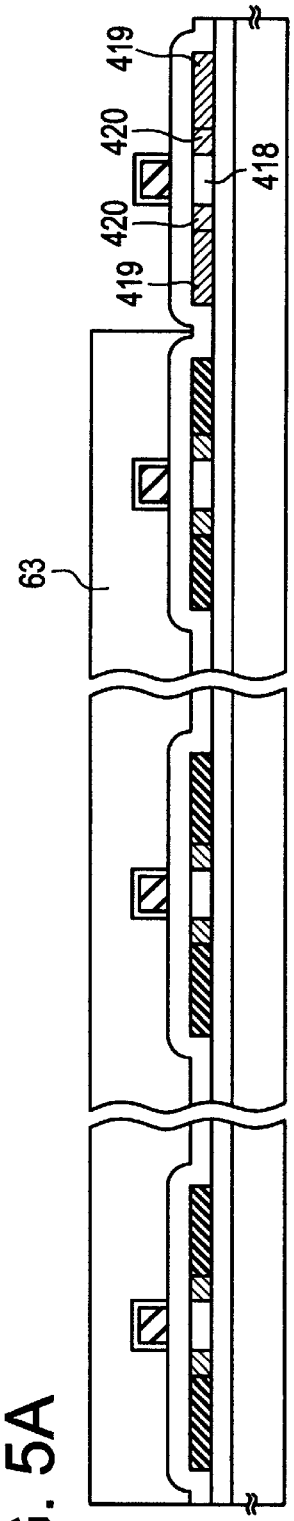
FIGS. 5A to 5C are diagrams for explaining the method of manufacturing the element substrate according to Embodiment 1 of the present invention.

As shown in FIG. 5A, to invert the N-type impurity regions in the semiconductor layer 402 of the CMOS-TFT 400 into P-type, other semiconductor layers are covered with a resist mask 63. In this state, B-ions for providing P-type conductivity are implanted by the ion doping method. The doping conditions include a dose of $2 \times 10^{15}/cm^2$ and an acceleration voltage of 65 kv. As a result, the N-type impurity regions 414 and 416 are inverted into P-type impurity regions 419 and 420, respectively. Then, laser annealing is carried out to activate the doped P-ions and B-ions (FIG. 5A).

Figure 5B:
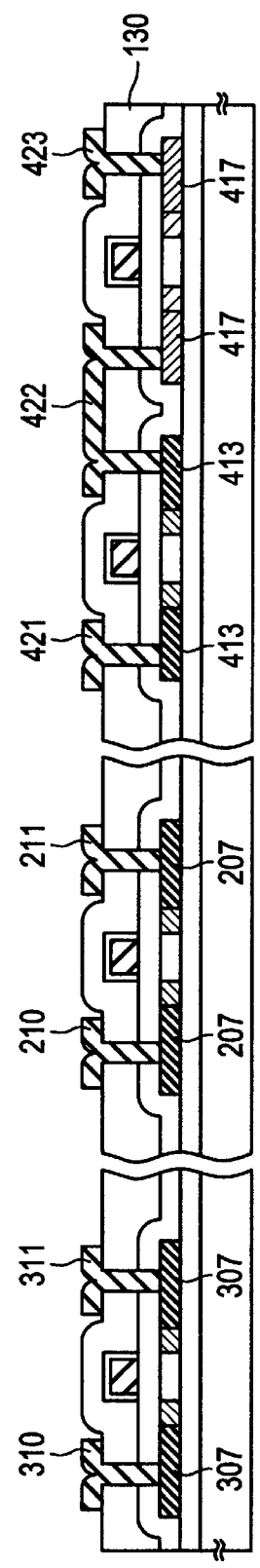

As shown in FIG. 5B, a first interlayer insulating film 130 is formed and contact holes reaching the N-type high-concentration impurity regions 207, 307, and 413 and the P-type impurity region 419 are formed. Thereafter, a metal film is formed and patterned to form wires 210, 211, 310, 311, 421, 422, and 423. To make the TFT 400 have a CMOS structure, the wire 422 is used to connect the N-type high-concentration impurity region 413 to the P-type impurity region 417.

In this embodiment, the first interlayer insulating film 130 is a 500-nm-thick silicon nitride film. As the first interlayer insulating film 130 may be used a silicon oxide film or silicon nitride film. It may be a multi-layer film consisting of these insulating films.

As a metal film for forming the wires 210, 211, 310, 311, 421, 422, and 423, a laminate film consisting of a titanium film, aluminum film and titanium film is formed by the sputtering method in this embodiment. The thicknesses of these films are 100 nm, 300 nm and 100 nm, respectively.

The pixel TFTs 200, the light receiving unit TFTs 300 and the CMOS-TFTs 400 are completed simultaneously through the above CMOS process (FIG. 5B).

Figure 5C:
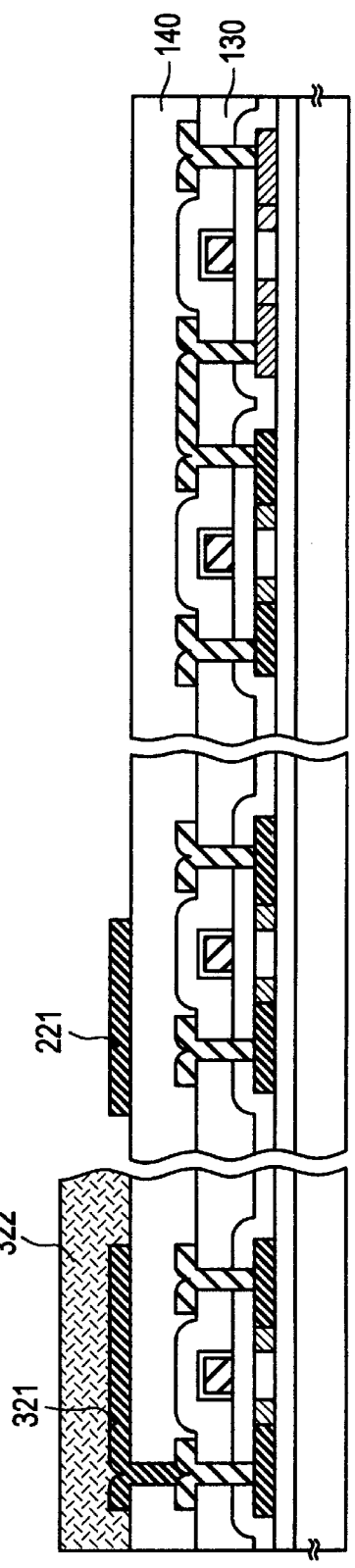

As shown in FIG. 5C, a second interlayer insulating film 140 for covering the TFTs 200, 300, and 400 is formed. The second interlayer insulating film 140 is preferably a resin film which can achieve a flat surface by cancelling the irregular surface of the underlayer. The resin film is made from polyimide, polyamide, polyimide amide or acryl. Alternatively, the surface layer of the second interlayer insulating film 140 may be a resin film to achieve a flat surface, and the underlayer thereof may be a single layer or multi-layer made from an inorganic insulating material such as silicon oxide, silicon nitride, silicon oxynitride or the like. In this embodiment, a polyimide film is formed to a thickness of 1.5 μm as the second interlayer insulating film 140.

Thereafter, a contact hole reaching the wire 310 of the light receiving unit TFT 300 is formed in the second interlayer insulating film 140 and a conductive film is formed. In this embodiment, a titanium film having a thickness of 200 nm is formed by the sputtering method as the conductive film.

The conductive film is then patterned to form a light shielding film 221 for the pixel TFT 200 and a lower electrode 312 connected to the light receiving TFT 300. Titanium and chromium can be used to form this conductive film.

An amorphous silicon film (to be referred to as "a-Si:H film" hereinafter) containing hydrogen and serving as a photoelectric conversion layer 322 is formed on the entire surface of the substrate. The film is then patterned such that only the a-Si:H film remains only in the light receiving unit 321 to form a photoelectric conversion layer 322 (FIG. 5C).

As shown in FIG. 2, a third interlayer insulating film 150 is formed. An insulating film for forming the third interlayer insulating film 150 is preferably made from a resin such as polyimide, polyamide, polyimide amide or acryl to achieve a flat surface. Alternatively, the surface layer of the third interlayer insulating film 150 may be the above resin film and the underlayer thereof may be a single layer or multi-layer film made from an inorganic insulating material such as silicon oxide, silicon nitride or silicon oxynitride. In this embodiment, a polyimide layer having a thickness of 0.5 μm is formed on the entire surface of the substrate as the insulating film.

After formation of the polyimide film, patterning is carried out. By this patterning, the polyimide film on the photoelectric conversion layer 322 is removed and the remaining polyimide film is made the third interlayer insulating film 150.

A contact hole reaching the wire 211 is further formed in the third and second interlayer insulating films 140, 150. In this embodiment, a dry etching method is used for patterning. A mixture gas of $O_2$ and $CF_4$ having an $O_2/CF_4$ mixing ratio of 95:5 is used as an etching gas to achieve a sufficient etching selection ratio of the a-Si:H film (photoelectric conversion layer 322) to the polyimide films (second and third interlayer insulating films 140, 150). When the selection ratio of the a-Si:H film to the polyimide film is not sufficient and the a-Si:H film is etched, the a-Si:H film may be formed thick in expectation of the amount of the a-Si:H film etched.

The above means of patterning is not limited to the dry etching method and may be any means if it enables the patterning of the second and third interlayer insulating films 140 and 150 and the formation of contact holes without influencing the photoelectric conversion layer 322.

Thereafter, a transparent conductive film is formed on the entire surface of the substrate and patterned to form a pixel electrode 223 connected to the pixel TFT 200 and a transparent electrode 323 for the photoelectric conversion element 320. The transparent conductive film may be made from ITO (Indium Tin Oxide) or $SnO_2$. In this embodiment, a 120-nm-thick ITO film is formed as the transparent conductive film (FIG. 2).

The element substrate 10 as shown in FIGS. 1 and 2 is completed through the above process. In this embodiment, the contact type linear sensor unit 30 and the control circuit 40 for controlling to display image data read by the linear sensor unit 30 are formed on the same substrate. Therefore, the device does not become bulky even when the number of its functions increases.

The manufacturing method and equipment of a conventional active matrix display device can be used to produce the linear sensor unit 30, thereby eliminating the need for new investment in equipment and facilities. Therefore, a multi-function display device can be provided at a low cost.

Since an image display device and a contact type image sensor for reading character information and graphic information on the paper are provided on the same substrate, the display device of this embodiment is suitable for use as a display device for portable information processing devices such as wordprocessors, notebook-type personal computers, and mobile computers.

In this embodiment, the production order of the TFTs 200, 300, and 400 and the photoelectric conversion elements 320 greatly influence the characteristic properties of TFTs and the characteristic properties of the photoelectric conversion elements. To improve the electric properties such as mobility of TFTs, crystallization and annealing steps and further hydrogenation are required for the semiconductor layer. However, these treatments may crystallize or dehydrogenates the a-Si:H of the photoelectric conversion layer 322, thereby reducing conversion efficiency.

Therefore, in this embodiment, after TFTs 200, 300, and 400 are completed, the photoelectric conversion elements 320 are formed to optimize the characteristic properties of the TFTs and the photoelectric conversion elements. By this production order, the linear sensor unit 30 can be made of a laminate structure consisting of the light receiving TFTs 300 and the photoelectric conversion elements 320, thereby making it possible to save space.

Embodiment 2

Figure 6:
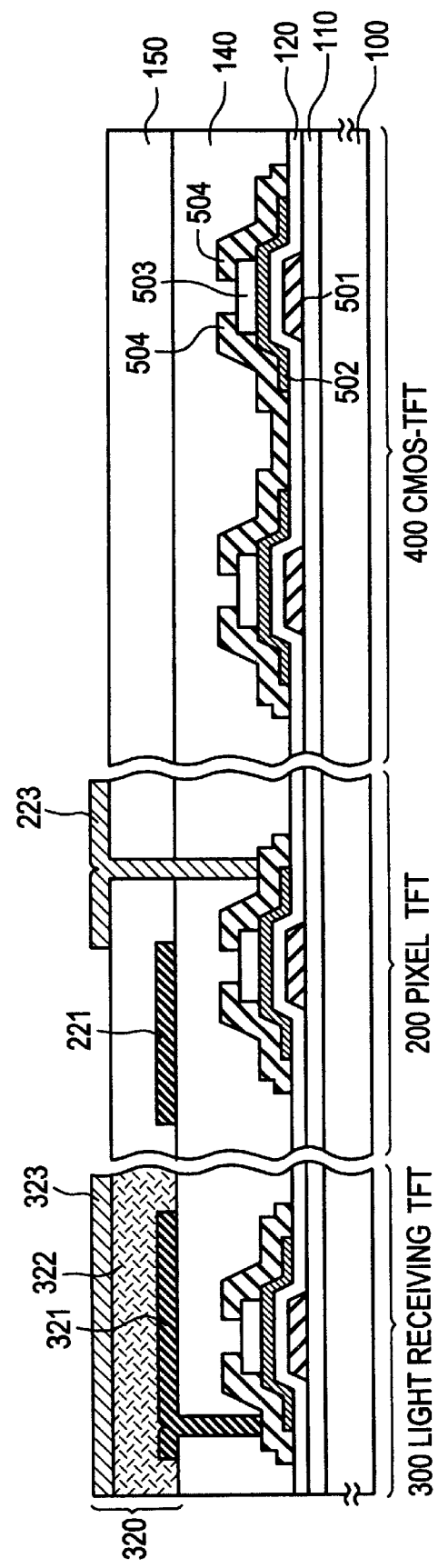
FIG. 6 is a sectional view of an element substrate according to Embodiment 2 of the present invention.

In Embodiment 1, the pixel TFTs 200, the light receiving elements 300, and CMOS-TFTs 400 forming the drive circuits and the control circuit are a top gate-type TFT. In Embodiment 2, these TFTs are a bottom gate-type TFT. FIG. 6 is a sectional view of the element substrate of this embodiment. In FIG. 6, the same reference symbols as those of FIG. 1 denote the same or corresponding members. To eliminate complexity, a reference symbol indicating a TFT structure is given only to the CMOS-TFT 400 but other TFTs have the same structure.

The bottom gate TFT of this embodiment has a gate electrode 501 formed on the base film 110, a semiconductor layer 502 formed on the gate insulating film 120, a channel stopper 503 formed on the channel forming region of the semiconductor layer 502 and a wire 504 connected to the semiconductor layer.

The method of manufacturing the bottom gate TFT of this embodiment is a known manufacturing method by which all the TFTs 200, 300, and 400 are completed simultaneously like Embodiment 1.

Embodiment 3

Figure 7:
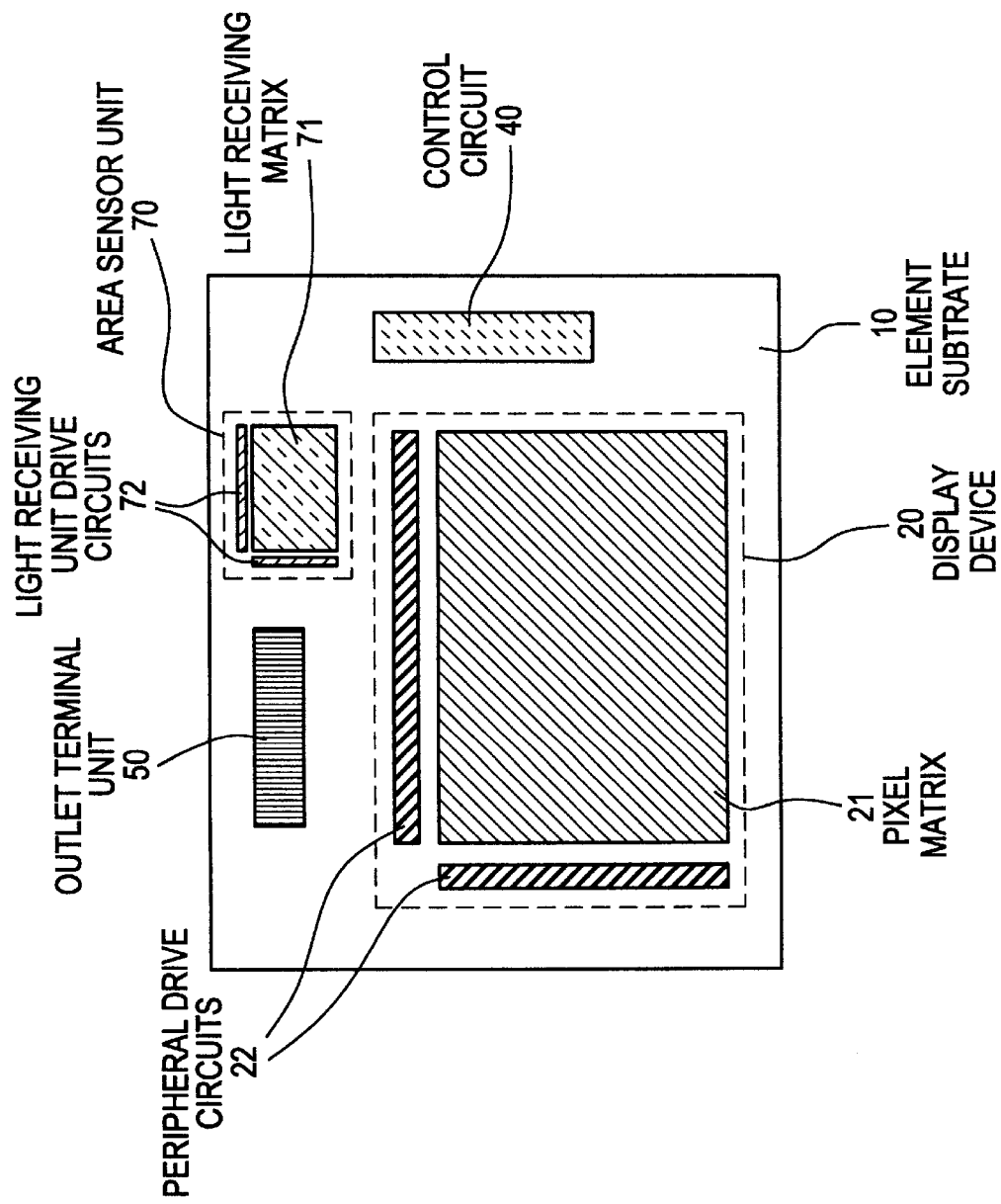
FIG. 7 is a front view of an element substrate according to Embodiment 3 of the present invention.

In Embodiment 1, the contact type line sensor is provided on the element substrate 10. In Embodiment 3, an area sensor having photoelectric conversion elements arranged in a matrix form is provided. FIG. 7 is a top view of the element substrate 10 of this embodiment. In FIG. 7, the same reference symbols as those of FIG. 1 denote the same or corresponding members.

As shown in FIG. 7, a display device 20, control circuit 40 and outlet terminal unit 50 are formed on the element substrate 10 like Embodiment 1 and an area sensor unit 70 is further formed on the substrate 10. The sectional view of the element substrate of this embodiment is the same as in FIG. 1 or FIG. 6.

The area sensor unit 30 has a light receiving matrix 71 and light receiving unit drive circuits 72. In the light receiving matrix 71, the photoelectric conversion elements 320 shown in Embodiment 1 are arranged two-dimensionally in a matrix form, and light receiving TFTs 300 connected to the photoelectric conversion elements 320 are arranged. The two light receiving unit drive circuits 72 jointly scan the light receiving matrix 71 to create image data.

When the element substrate 10 of this embodiment is made as a module, an optic such as a lens is provided to face the area sensor unit 70. Since an image reduced by the optic is projected onto the area sensor 70 and detected, a dynamic image can be picked up.

In this embodiment, the arrangement of the pixel electrodes 223 of the pixel matrix 21 may be made the same as the arrangement of the photoelectric conversion elements 320 of the light receiving matrix 71. In this case, since the address of a pixel electrode 223 corresponds to the address of a light receiving cell, image data detected by the area sensor unit can be processed by the control circuit 40 with ease at a high speed to be displayed on the display device 20.

For instance, when the number of pixels of the pixel matrix 21 is VGA standard 640×480, the area of the pixel electrode is ca. 10 $\mu$m×10 $\mu$m. When the number of cells of the light receiving matrix 71 is 640×480, the area of the cell is ca. 6.4 mm×4.8 mm. Therefore, the area sensor unit 71 can be integrated on the element substrate 10 of the active matrix display device.

Since an image pick-up device comprising the display device and the area sensor unit 70 is provided integrally in this embodiment, the device of the present invention is suitable for use in the display device having a communication function of a teleconferencing system, TV phone, Internet terminal or the like. For instance, an image of a user can be picked up by the area sensor unit 70 and transmitted to the terminal of the other party while the user is looking at an image transmitted from the terminal of the other party on the display device. Thus, a dynamic image can be communicated in two ways.

Embodiment 4

Figure 8:
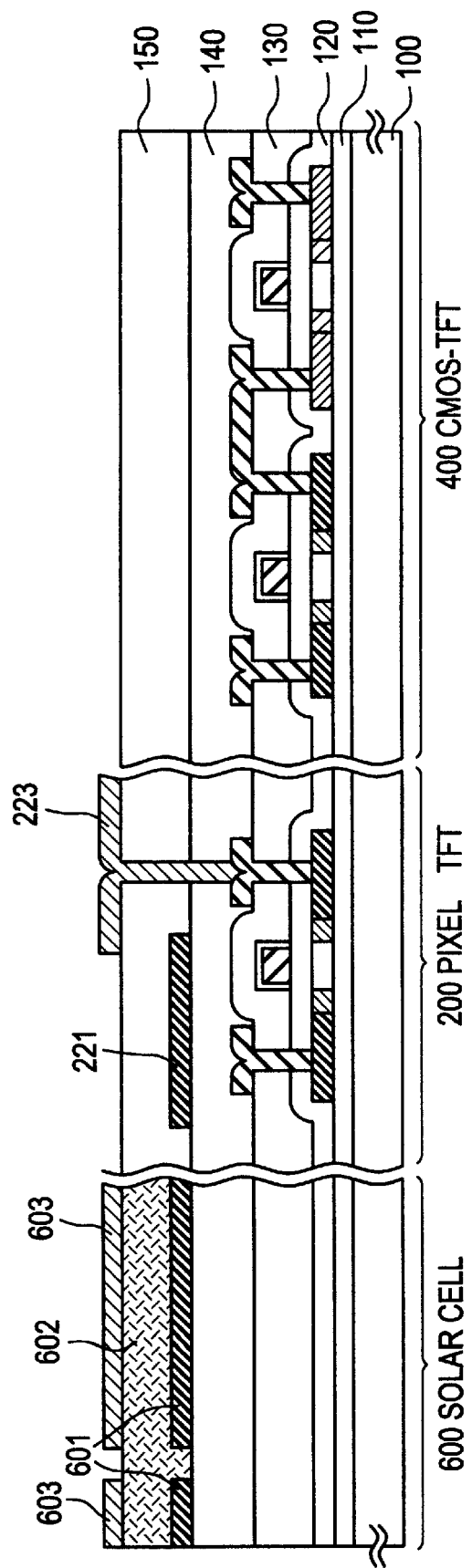
FIG. 8 is a sectional view of an element substrate according to Embodiment 4 of the present invention.

In Embodiments 1 to 3, examples in which the image sensor is provided on the element substrate are described. In Embodiment 4, description is made of an example in which solar cells are provided in place of the image sensor. FIG. 8 is a sectional view of the element substrate of this embodiment. In FIG. 8, the same reference symbols as those of FIG. 2 denote the same or corresponding members which are manufactured by the same process as that of Embodiment 1, and solar cells 600 are provided in place of the light receiving TFTs 300 and the photoelectric conversion elements 320.

The pixel TFTs 200 and the CMOS-TFTs 400 are first completed by the process shown in Embodiment 1. At this point, films which do not need to be patterned are also formed on a portion of the solar cells 600. That is, the base film 110, the gate insulating film 120 and the first interlayer insulating film 130 are formed.

Thereafter, the second interlayer insulating film 140 is formed on the entire surface of the substrate 100. A conductive film is formed on the second interlayer insulating film 140. In this embodiment, a 200-nm-thick titanium film is formed by the sputtering method as the conductive film. The conductive film is patterned to form a light shielding film 221 for the pixel TFT 200 and rear electrodes 601 for the solar cell. The rear electrode 601 is patterned like a belt. As the starting film of the light shielding film 221 and the rear electrode 601, a titanium film or a chromium film may be used.

A photoelectric conversion layer 602 is then formed. The photoelectric conversion layer 602 is made from a semiconductor such as intrinsic a-Si:H, Si having a PIN junction or SiGe. In this embodiment, an a-Si:H film is formed as the photoelectric conversion layer 602. This a-Si:H film is patterned to form a photoelectric conversion layer 602 by leaving it only on the solar cells 600.

An interlayer insulating film 150 is then formed. A polyimide film is first formed on the entire surface of the substrate and patterned, and a portion of the polyimide layer on the photoelectric conversion layer 322 is removed to form a third interlayer insulating film 150. Further, a contact hole reaching the wire 211 is formed in the second and third interlayer insulating films.

In this embodiment, a dry etching method is used for patterning. A mixture gas of $O_2$ and $CF_4$ having an $O_2/CF_4$ mixing ratio of 95:5 is used as an etching gas to achieve a sufficient etching selection ratio of the a-Si:H film (photoelectric conversion layer 602) to the polyimide films (second and third interlayer insulating films 140 and 150). When the selection ratio of the a-Si:H film to the polyimide film is not sufficient and the a-Si:H film is etched, the a-Si:H film may be formed thick in expectation of the amount of the a-Si:H film etched.

The above means of patterning is not limited to the dry etching method and may be any means if it enables the patterning of the second and third interlayer insulating films 140 and 150 and the formation of contact holes without influencing the photoelectric conversion layer 322.

Thereafter, a transparent conductive film is formed on the entire surface of the substrate and patterned to form pixel electrodes 223 connected to the pixel TFTs 200 and transparent electrodes 603 for the solar cells. The transparent conductive film may be made from ITO or $SnO_2$. In this embodiment, a 120-nm-thick ITO film is formed as the transparent conductive film.

The terminal unit transparent electrode 603 of the solar cell 600 is connected to the adjacent rear electrode 602. Since the a-Si:H layer having low conductivity is used as the photoelectric conversion layer 602 in this embodiment, the photoelectric conversion layer 602 is not divided for each cell. However, when the a-Si:H layer having high conductivity is used, the step of dividing the photoelectric conversion layer 602 is required.

The element substrate as shown in FIG. 8 is completed through the above process. As the solar cells 600 in this embodiment are compatible with the pixel matrix in process except the method of manufacturing the photoelectric conversion layer 602, the manufacturing method and equipment of a conventional active matrix display device can be used, thereby eliminating the need for new investment in equipment and facilities. Therefore, a multi-function display device can be provided at a low cost.

In this embodiment, only the solar cells 600 are newly provided. However, the linear sensor unit 30 of Embodiment 1 and the area sensor unit 70 of Embodiment 3 may be provided together with the solar cells 600. In this case, when the photoelectric conversion layer 602 of the solar cell 600 and the photoelectric conversion layer 322 of the photoelectric conversion element 320 of the light receiving unit are produced in the same step, the number of the manufacturing steps can be reduced. In this case, the rear electrode 601 of the solar cell 600 and the lower electrode 321 of the photoelectric conversion element 320 are produced in the same step as that of the light shielding film 221 of the pixel TFT 200, and the transparent electrode 603 of the solar cell 600 and the transparent electrode 323 of the photoelectric conversion element 320 are produced in the same step as that of the pixel electrode 223.

According to the present invention, since an image sensor or optically electromotive device is provided on the same substrate as the pixel matrix and the peripheral drive circuits, a display device having a display function and an image pick-up function can be reduced in size and weight.

In the present invention, the manufacturing method and equipment of a conventional active matrix display device can be used to produce the image sensor or optically electromotive device, new investment in equipment and facilities is not necessary, thereby making it possible to reduce production costs. Consequently, a multi-function display device can be provided at a low cost.

What is claimed is:

1. An active matrix display device comprising a pixel matrix having pixel electrodes arranged in a matrix form and first active elements connected to the pixel electrodes and peripheral drive circuits for driving the first active elements, all of which are provided on the same substrate, wherein:

an image sensor comprising a light receiving unit having photoelectric conversion elements and second active elements connected to the photoelectric conversion elements and a drive circuit for driving the second active elements is provided on the substrate; and each of the photoelectric conversion elements has a first electrode, a photoelectric conversion layer formed on the first electrode, and a second electrode formed on the photoelectric conversion layer, the first and second electrodes being made of the same film as a conductive film formed on the pixel matrix.

2. An active matrix display device comprising a pixel matrix having pixel electrodes arranged in a matrix form and first active elements connected to the pixel electrodes and peripheral drive circuits for driving the first active elements, all of which are provided on the same substrate, wherein:

an optically electromotive device is provided on the substrate; and the optically electromotive device has a first electrode, a photoelectric conversion layer formed on the first electrode and a second electrode formed on the photoelectric conversion layer, the first and second electrodes being made of the same film as a conductive film formed on the pixel matrix.

3. An active matrix display device comprising a pixel matrix having pixel electrodes arranged in a matrix form and first active elements connected to the pixel electrodes and peripheral drive circuits for driving the first active elements, all of which are provided on the same substrate, wherein an image sensor comprising a light receiving unit having photoelectric conversion elements and second active elements connected to the photoelectric conversion elements and a drive circuit for driving the second active elements is provided on the substrate;

said pixel matrix has first active elements formed on the substrate, a first insulating film covering the first active elements, a light shielding film formed on the first insulating film, a second insulating film formed on the light shielding film, and pixel electrodes formed on the second insulating film and electrically connected to the first active elements through contact holes formed in the first and second insulating films; and said light receiving unit has second active elements formed on the substrate, the first insulating film covering the second active elements, lower electrodes formed on the first insulating film and made of the same film as the light shielding film, a photoelectric conversion layer formed on the lower electrodes and transparent electrodes formed on the photoelectric conversion layer and made of the same film as the pixel electrodes.

4. A device according to claim 3, wherein said first and second active elements are thin film transistors, and said peripheral drive circuits and said drive circuit are formed of thin film transistors.

5. A method of manufacturing an active matrix display device comprising:

a pixel matrix having pixel electrodes arranged in a matrix form and first active elements connected to the pixel electrodes;

peripheral drive circuits for driving the first active elements; and an image sensor comprising a light receiving unit having photoelectric conversion elements and second active elements connected to the photoelectric conversion elements and a drive circuit for driving the second active elements, all of which are formed on the same substrate, said method comprising:
- a first step of producing said first active elements, said second active elements, said peripheral drive circuits and said drive circuit;
- a second step of forming a first insulating layer for covering at least said first active elements and said second active elements;
- a third step of forming a conductive film on the first insulating film;
- a fourth step of patterning the conductive film to form a light shielding film for shielding light from said first active elements and lower electrodes connected to said second active elements;
- a fifth step of forming a photoelectric conversion layer on the lower electrodes;
- a sixth step of forming a second insulating film on the light shielding film;
- a seventh step of forming a transparent conductive film for covering at least the photoelectric conversion layer and the second insulating film; and
- an eighth step of patterning the transparent conductive film to form pixel electrodes connected to said first active elements and transparent electrodes in contact with the photoelectric conversion layer.

6. A method according to claim 5, wherein said first and second active elements are formed of thin film transistors, and said peripheral drive circuits and said drive circuits are formed of thin film transistors.

* * * * *